United States Patent
Schwarzenbach et al.

(10) Patent No.: US 11,876,020 B2
(45) Date of Patent: Jan. 16, 2024

(54) METHOD FOR MANUFACTURING A CFET DEVICE

(71) Applicant: Soitec, Bernin (FR)

(72) Inventors: Walter Schwarzenbach, Saint Nazaire les Eymes (FR); Ludovic Ecarnot, Grenoble (FR); Nicolas Daval, Goncelin (FR); Bich-Yen Nguyen, Austin, TX (US); Guillaume Besnard, Acigné (FR)

(73) Assignee: SOITEC, Bernin (FR)

( * ) Notice: Subject to any disclaimer, the term of this patent is extended or adjusted under 35 U.S.C. 154(b) by 497 days.

(21) Appl. No.: 17/250,767

(22) PCT Filed: Sep. 3, 2019

(86) PCT No.: PCT/FR2019/052026
§ 371 (c)(1),
(2) Date: Mar. 2, 2021

(87) PCT Pub. No.: WO2020/049251
PCT Pub. Date: Mar. 12, 2020

(65) Prior Publication Data
US 2021/0202326 A1     Jul. 1, 2021

(30) Foreign Application Priority Data

Sep. 3, 2018   (FR) .................................. 1857894

(51) Int. Cl.
*H01L 21/762*     (2006.01)
*H01L 21/8238*     (2006.01)
*H01L 21/324*     (2006.01)

(52) U.S. Cl.
CPC .. *H01L 21/823821* (2013.01); *H01L 21/3247* (2013.01); *H01L 21/7624* (2013.01)

(58) Field of Classification Search
CPC ..... H01L 21/84; H01L 21/845; H01L 21/324; H01L 21/3247; H01L 21/762;
(Continued)

(56) References Cited

U.S. PATENT DOCUMENTS 6,468,663 B1 * 10/2002 Sato .................. H01L 21/02428
428/688
7,514,341 B2    4/2009   Neyret et al.
(Continued)

FOREIGN PATENT DOCUMENTS

EP      1158581 B1     4/2016
FR      2895563 B1     4/2008
(Continued)

OTHER PUBLICATIONS

Singapore Written Opinion for Application No. 11202101776X dated Sep. 14, 2022, 18 pages.
(Continued)

*Primary Examiner* — Chuong A Luu
(74) *Attorney, Agent, or Firm* — TraskBritt

(57) ABSTRACT

A method for manufacturing a CFET device comprises forming a substrate of the double semi-conductor on insulator type, successively comprising, from the base to the surface thereof: a carrier substrate, a first electrically insulating layer, a first single-crystal semiconductor layer, a second electrically insulating layer and a second single-crystal semiconductor layer. Slices are formed into the substrate to the first electrically insulating layer so as to form at least one fin (F). A channel of a first transistor is formed in the first semiconductor layer and a channel of a second transistor is formed opposite the first transistor in the second semiconductor layer. Formation of the substrate of the double semi-conductor on insulator type comprises: a first and a second step of transferring a layer and thermal
(Continued)

processing at a temperature that is sufficiently high to smooth the first single-crystal semiconductor layer to a roughness lower than 0.1 nm RMS.

20 Claims, 3 Drawing Sheets

(58) Field of Classification Search
CPC ........... H01L 21/7624; H01L 21/76224; H01L 21/8238; H01L 21/823821; H01L 21/8234; H01L 21/823431; H01L 27/12; H01L 27/1211
USPC ........................................................ 257/154
See application file for complete search history.

(56) References Cited

U.S. PATENT DOCUMENTS

| | | | |
|---|---|---|---|
| 9,755,015 B1* | 9/2017 | Phelps | H01L 21/764 |
| 9,812,575 B1 | 11/2017 | Reznicek et al. | |
| 10,438,840 B2* | 10/2019 | Wells | H01L 21/02381 |
| 11,374,118 B2* | 6/2022 | Or-Bach | H01L 23/367 |
| 2004/0063298 A1 | 4/2004 | Aga et al. | |
| 2006/0289940 A1 | 12/2006 | Hyun et al. | |
| 2007/0148910 A1 | 6/2007 | Neyret et al. | |
| 2007/0181947 A1 | 8/2007 | Chan et al. | |

FOREIGN PATENT DOCUMENTS

| | | |
|---|---|---|
| WO | 2010/106101 A1 | 9/2010 |
| WO | 2017/095409 A1 | 6/2017 |

OTHER PUBLICATIONS

Taiwanese Office Action for Application No. 11120966480 dated Sep. 30, 2022, 7 pages.
Acosta-Alba et al., Smoothening by Self-Diffusion of Silicon During Annealing in a Rapid Processing Chamber, Solid State Phenomena, vols. 205-206 (2014), pp. 364-369.
International Search Report for International Application No. PCT/FR2019/052026 dated Nov. 25, 2019, 3 pages.
International Written Opinion for International Application No. PCT/FR2019/052026 dated Nov. 25, 2019, 6 pages.
Kononchuk et al., Internal Dissolution of Buried Oxide in SOI Wafers, Solid State Phenomena, vols. 131-133 (2008), pp. 113-118.
Schwarzenbach et al., Atomic Scale Thickness Control of SOI Wafers for Fully Depleted Applications, Journal of the Electrochemical Society, (May 2013), 6 pages.
Schwarzenbach et al., Excellent Silicon Thickness Uniformity Ultra-Thin SOI for Controlling Vt Variation of FDSOI, 2011 IEEE International Conference on IC Design & Technology, (May 2-4, 2011), 2 pages.
Wu et al., Stacked 3-D Fin-CMOS Technology, IEEE Electron Device Letters, vol. 26, No. 6, (Jun. 2005), pp. 416-418.

* cited by examiner

METHOD FOR MANUFACTURING A CFET DEVICE

CROSS-REFERENCE TO RELATED APPLICATIONS

This application is a national phase entry under 35 U.S.C. § 371 of International Patent Application PCT/FR2019/052026, filed Sep. 3, 2019, designating the United States of America and published as International Patent Publication WO 2020/049251 A1 on Mar. 12, 2020, which claims the benefit under Article 8 of the Patent Cooperation Treaty to French Patent Application Serial No. 1857894, filed Sep. 3, 2018.

TECHNICAL FIELD

The present disclosure relates to a process for fabricating a CFET device.

BACKGROUND

A CFET device (CFET being the acronym of "complementary field-effect transistor") may be defined as a structure comprising complementary fin field-effect transistors (FinFETs). In other words, it is a three-dimensional electronic device consisting of stacking two FinFET transistors of different types, for example, an n-type transistor (so-called nFET) on a p-type transistor (so-called pFET).

Such a stack allows the footprint of the device to be decreased and therefore the density of transistors per unit area to be increased.

Conventionally, a CFET device is produced from a bulk single-crystal silicon substrate integrating a buried sacrificial layer. This sacrificial layer may, for example, be a silicon-germanium (SiGe) layer, in which vertical trenches are etched that allow the various fins of the transistors to be defined. The selective etching of the sacrificial layer allows the vertical physical separation of these two n-type and p-type FinFET transistors.

The active zones intended to form the source and drain regions of the complementary FinFET transistors may be n- and p-doped, for example, by selective implantation in the thickness of the structure thus formed.

Moreover, depending on the type of application targeted, the channels could be n- or p-doped. This doping may also be carried out by selective implantation in the thickness of the structure.

The decrease in the width of the fins must be accompanied by an increase in the height of the active zones, and, in particular, of the channels, in order to allow the amount of electrical current that is able to be passed to be increased.

However, there are technological limitations to the fabrication of the fins, in particular, in terms of height/width ratio, so that the density of transistors per unit area achievable while keeping an acceptable electrical performance tends toward a threshold.

BRIEF SUMMARY

One aim of the present disclosure is to improve the design and fabrication of CFET devices.

To this end, the present disclosure proposes a process for fabricating a CFET device, comprising:
forming a double semiconductor-on-insulator substrate comprising, in succession, from its base to its surface:
a carrier substrate, a first electrically insulating layer, a first single-crystal semiconductor layer, a second electrically insulating layer and a second single-crystal semiconductor layer;
forming trenches from the surface of the substrate, to the first electrically insulating layer, forming at least one fin,
in each fin, forming a channel of a first transistor in the first semiconductor layer and a channel of a second transistor of opposite type to the first transistor in the second semiconductor layer,
the formation of the double semiconductor-on-insulator substrate comprising:
a first layer-transfer step in order to transfer the first electrically insulating layer and the first single-crystal semiconductor layer to the carrier substrate, forming a first semiconductor-on-insulator substrate, the first layer-transfer step comprising a heat treatment at a sufficiently high temperature to smooth the first single-crystal semiconductor layer to a roughness lower than 0.1 nm RMS,
after the heat treatment, a second layer-transfer step in order to transfer the second electrically insulating layer and the second single-crystal semiconductor layer to the first single-crystal semiconductor layer of the first semiconductor-on-insulator substrate.

According to advantageous but optional features of this process, which may be implemented alone or in combination when this is technically appropriate:
the trenches are formed by etching, the first electrically insulating layer forming a stop layer for the etching;
the thickness of the first and second single-crystal semiconductor layers is between 25 and 40 nm;
the thickness of the second electrically insulating layer is between 10 and 30 nm;
the smoothing heat treatment of the first single-crystal semiconductor layer is carried out at a temperature between 1000 and 1200° C., for a time between 10 and 120 minutes;
the process further comprises a heat treatment for finishing the second single-crystal semiconductor layer at a temperature between 1100 and 1250° C., carried out for a time shorter than one minute.

The CFET device thus formed comprises a carrier substrate and at least one fin extending from the carrier substrate, in which fin two superposed field-effect transistors of opposite types are arranged, the device wherein each fin comprises, starting from the carrier substrate:
a first electrically insulating layer;
a first single-crystal semiconductor layer, forming the channel of a first transistor;
a second electrically insulating layer;
a second single-crystal semiconductor layer, forming the channel of a second transistor.

By "superposed" what is meant is the transistors are stacked in a direction perpendicular to the main surface of the carrier substrate.

As regards the first and second semiconductor layer, the embodiments below are envisionable, optionally in combination when this is technically relevant:
the first and second semiconductor layers are made of silicon doped opposite types;
the first and second semiconductor layers are made of silicon having different crystal orientations;
the first and second semiconductor layers are made of different materials;
the semiconductor layer in which the channel of an n-type transistor is formed is made of strained silicon;

the semiconductor layer in which the channel of a p-type transistor is formed is made of silicon-germanium.

As regards the first and second electrically insulating layer, the embodiments below are envisionable, optionally in combination when this is technically relevant:
  the first and/or second electrically insulating layers are made of silicon oxide ($SiO_2$);
  the first and second electrically insulating layers are made of different materials;
  the first electrically insulating layer is made of a material of high dielectric constant ("high-k" material);
  the second electrically insulating layer is made of a material of low dielectric constant ("low-k" material).

According to one form of execution, the carrier substrate comprises at least one additional layer chosen from the following layers:
  a charge-trapping layer;
  an epitaxial semiconductor layer;
  a COP-free CZ silicon layer, i.e., a layer devoid of crystal defects of COP type.

In certain embodiments, the fabrication of a CFET device may comprise:
  forming a double semiconductor-on-insulator substrate comprising, in succession, from its base to its surface: a carrier substrate including a functional layer (such as a polysilicon layer, a layer of so-called COP-free single-crystal silicon or an epitaxial semiconductor layer, which may optionally be doped), a first electrically insulating layer, a first single-crystal semiconductor layer, a second electrically insulating layer and a second single-crystal semiconductor layer;
  forming trenches from the surface of the substrate, to the first electrically insulating layer, so as to form at least one fin,
  in each fin, forming a channel of a first transistor in the first semiconductor layer and a channel of a second transistor of opposite type to the first transistor in the second semiconductor layer,
  the formation of the double semiconductor-on-insulator substrate comprising:
    a first layer-transfer step in order to transfer the first electrically insulating layer and the first single-crystal semiconductor layer to the carrier substrate, so as to form a first semiconductor-on-insulator substrate, from a first donor substrate comprising a layer suitable for being etched selectively with respect to the first single-crystal semiconductor layer (the layers may advantageously be created by epitaxy) and a weakened zone (able to advantageously be formed by implantation of atomic species) located at a depth in the first donor substrate strictly larger than the thickness of the two aforementioned layers,
    after selective etching of the layer suitable for being etched selectively with respect to the first single-crystal semiconductor layer, a second layer-transfer step in order to transfer the second electrically insulating layer and the second single-crystal semiconductor layer to the first single-crystal semiconductor layer of the first semiconductor-on-insulator substrate.

Particularly advantageously, the process does not employ a thermal budget liable to damage the functional layer but allows a roughness of the first single-crystal semiconductor layer lower than 0.1 nm RMS to be obtained.

BRIEF DESCRIPTION OF THE DRAWINGS

Other features and advantages of the present disclosure will emerge from the detailed description that follows, with reference to the appended drawings in which.

Figure 1:
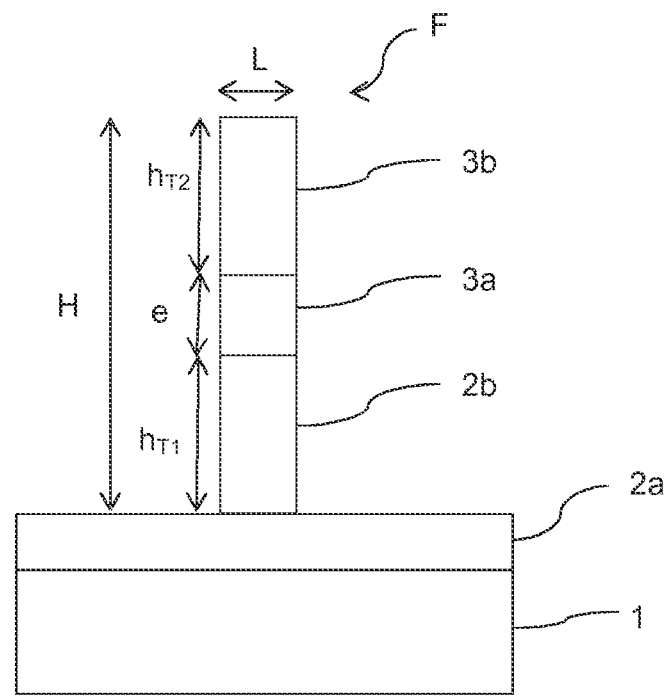
FIG. 1 is a schematic cross-sectional view of a CFET device according to one embodiment.

To make the drawings clearer, the various figures have not necessarily been drawn to scale.

In the figures, identical reference signs have been used to reference elements that are identical or that perform the same function.

DETAILED DESCRIPTION

The present disclosure proposes to replace, to form a CFET device, the aforementioned bulk silicon substrate with a semiconductor-on-insulator substrate comprising a carrier substrate, two single-crystal semiconductor layers and two electrically insulating layers respectively separating the two semiconductor layers on the one hand and the carrier substrate and the semiconductor layer closest to the carrier substrate on the other hand.

Such a semiconductor-on-insulator substrate is qualified a "double SOI" because of the presence of the two pairs of semiconductor layers and of electrically insulating layers, with respect to a conventional SOI substrate (SOI being the acronym of silicon-on-insulator) that comprises one single-crystal semiconductor layer and one electrically insulating layer intermediate between the carrier substrate and the semiconductor layer.

The carrier substrate may be made of a semiconductor (for example, silicon) or of another material, depending on whether it must solely perform a mechanical carrier function or an electrical function within the device.

Such a double SOI substrate may be fabricated by two successive transfers of a single-crystal semiconductor layer to the carrier substrate. It is possible, in particular, to use the SMARTCUT™ process, which comprises the following steps:
  providing the carrier substrate,
  providing a first single-crystal semiconductor donor substrate,
  forming a weakened zone in the donor substrate, in order to define therein a first thin surface layer (the weakened zone possibly being formed by implantation of atomic species at a defined depth in the donor substrate),
  bonding the first donor substrate to the carrier substrate, a first electrically insulating layer being at the bonding interface,
  detaching the first donor substrate along the weakened zone, leading to the transfer of the first thin layer to the carrier substrate (obtainment of an SOI),
  carrying out finishing processing on the first transferred layer, in order to repair or remove defects related to the detaching step and to give the layer the final roughness and thickness characteristics desired,
  providing a second single-crystal semiconductor donor substrate, which may possibly be identical to the first or different,
  forming a weakened zone in the second donor substrate, so as to define therein a second thin surface layer,
  bonding the second donor substrate to the SOI formed beforehand, a second electrically insulating layer being at the bonding interface between the transferred first semiconductor layer and the second donor substrate, detaching the second donor substrate along the weakened zone, leading to the transfer of the second thin layer to the carrier substrate (obtainment of the double SOI), carrying out finishing processing on the second transferred layer, in order to repair or remove defects related to the detaching step and to give the layer the final roughness and thickness characteristics desired.

Details of the implementation of this process will be described below with reference to FIGS. 3A-3F.

Each of the single-crystal semiconductor layers is intended to form the active zones (source, drain and channel) of a respective FinFET transistor, the two transistors being of opposite types. For example, the active zone of a pFET transistor is formed in the first single-crystal semiconductor layer, which is closest to the carrier substrate, and the active zone of an nFET transistor is formed in the second single-crystal semiconductor layer, which is furthest from the carrier substrate. Conversely, according to another example, the active zone of an nFET transistor may be formed in the first single-crystal semiconductor layer and the active zone of a pFET transistor may be formed in the second single-crystal semiconductor layer.

In a way known per se, dry etching is carried out on the double SOI substrate to form trenches allowing parallel fins to be defined.

In the present text, what is meant by "width" (denoted L in FIG. 1) of a fin is its dimension in a direction parallel to a main surface of the carrier substrate, which defines the width of the channel, and by "height" (denoted H in FIG. 1) its dimension in a direction perpendicular to the main surface of the carrier substrate, i.e., in the direction of the thickness of the double SOI substrate. The length of the channel extends in a direction perpendicular to the dimensions L and H and is defined by the distance between the source and the drain, which are distributed in this direction.

With respect to the known CFET device, use of a double SOI substrate has a number of advantages.

On the one hand, the height (denoted $h_{T1}$ and $h_{T2}$ in FIG. 1) of the n and p channels is equal to the thickness of the semiconductor layers in which they are formed; this height is therefore very precisely controlled because of the quality of the layer-transfer process, which ensures a high precision and a high uniformity in the thickness of the transferred semiconductor layer and of the electrically insulating layer. The thickness of the transferred semiconductor layers after the finishing step will possibly be, for example, between 4 and 100 nm, with a control of this thickness of as great as +/−0.5 nm about the targeted objective. The thickness of the created electrically insulating layers will possibly be, for example, between 10 and 200 nm (the limit of 200 nm, in particular, applying to the first electrically insulating layer, the second electrically insulating layer advantageously being much thinner), with a control of this thickness of as great as +/−1 nm about the targeted objective. The control of the variability of the thickness of the transferred/created layers is justified by its effects, which are well known to those skilled in the art, on the variability of the transistors. In the prior-art CFET device, the height of the channels is defined by horizontal etches that are not well controlled.

Furthermore, the n and p channels are separated by a layer that not only forms a physical boundary but also electrically insulates the channels. Likewise, the channel of the transistor closest the carrier substrate is physically and electrically insulated from the carrier substrate.

Furthermore, the first electrically insulating layer advantageously forms an etch-stop layer during the formation of the trenches.

Moreover, the process for fabricating the double SOI substrate allows the materials of the single-crystal semiconductor layers and of the electrically insulating layers to be varied in order to adapt them to the sought-after performance.

Thus, in one embodiment, the two single-crystal semiconductor layers are both made of silicon, but with different doping types. Preferably, the two layers are weakly doped, i.e., with a dopant concentration lower than or equal to $10e15$ at/cm$^3$.

In another embodiment, or in a way combined with the preceding one, the single-crystal semiconductor layers are both made of silicon, but with different crystal orientations. This allows the mobility of the carriers in each of the two FinFET transistors to be optimized: specifically, the crystal orientation of the active zone that procures the best carrier mobility for an n-type transistor is different from the optimal crystal orientation that procures the best carrier mobility for a p-type transistor.

In another embodiment, the single-crystal semiconductor layers are made of different materials.

For example, for an nFET transistor, silicon may advantageously be replaced by strained silicon. For a pFET transistor, silicon may advantageously be replaced by silicon-germanium. These alternative materials allow the charge-carrier mobility in the channel of the respective transistor to be increased.

The choice of the material of each semiconductor layer solely requires a suitable donor substrate to be used during the fabrication of the double SOI substrate.

Moreover, the n- or p-doping may be carried out before the transfer of each semiconductor layer to the carrier substrate, so as to avoid damaging the device with a subsequent implantation of dopants.

In one embodiment, the two electrically insulating layers are made of the same material, silicon oxide ($SiO_2$), for example. The oxide layers are obtained conventionally by thermal oxidation of a silicon substrate.

Alternatively, the two electrically insulating layers are made of different materials.

Thus, according to one embodiment, the first electrically insulating layer may be made of a so-called "high-k" material, i.e., a material of high dielectric constant, such as, for example, nonlimitingly, hafnium oxide or zirconium oxide (in particular, $HfO_2$, HfON, HfSiO, HfSiON, $ZrO_2$, $HfZrO_2$, or HfZrO). With respect to silicon oxide, such a material may perform an etch-stop function better because of a higher selectivity with respect to the material of the first single-crystal semiconductor layer.

According to one embodiment, the second electrically insulating layer may be made of a so-called "low-k" material, i.e., a material of low dielectric constant, such as, for example, and nonlimitingly, carbon- and/or fluorine-doped silicon oxide (in particular, SiOC, SiOF, SiOCF, SiOCH), but also a porous oxide or an organic material (for example, polytetrafluoroethylene (PTFE), polyimide, parylene). With respect to a silicon-oxide layer, and for a given electrical-insulation performance, a layer of such a material is thinner (the ratio between the thicknesses of the layers of these two materials corresponding to the ratio between their dielectric permittivities). This configuration is particularly advantageous because, as mentioned above, the increase in the density, while keeping an acceptable transistor electrical performance, is limited by the height/width ratio of the fins, and by the spacing required between the fins. For a given height of the fins, the decrease in the thickness (denoted e in FIG. 1) of the second electrically insulating layer is therefore beneficial to the active zones, and, in particular, to the channels that may have a larger height ($h_{T1}$, $h_{T2}$) and therefore a better performance with respect to current. For example, an $SiO_2$ layer of 20 nm separating two channels of 30 nm height may be replaced by a carbon-doped porous $SiO_2$ layer of 10 nm; the gain in height for the two channels is therefore 10 nm in total, i.e., an increase of almost 20% in the height of each channel.

The various material options described above with respect to the electrically insulating layers and the single-crystal semiconductor layers may be freely combined by anyone skilled in the art depending on the specificities of the device and of the sought-after performance.

Another advantage of the double SOI substrate is that the carrier substrate itself may be functionalized. In other words, the carrier substrate does not solely perform a mechanical carrier function for the transistors, but may comprise one or more layers playing a particular role in the operation of the device, or one or more electronic components allowing the device to perform a plurality of functions in a system-on-chip device. Such a functionalization of the carrier substrate may be achieved during or, in particular, before the fabrication of the double SOI substrate through the choice of the carrier substrate.

For example, the carrier substrate may comprise a layer for trapping electric charge, which may take the form of a polysilicon layer. Such a layer is particularly useful to the operation of a radiofrequency device, which may therefore be combined with the CFET device, thus allowing components intended for logic and computation and the radiofrequency (RF) components required to manage connectivity to be integrated into the same chip. This layer, which contains many electrical traps, limits self-bias, and crosstalk between transistors via the substrate (induced by the strong electromagnetic emission of the radiofrequency transistors). This layer allows this interference to be decreased by trapping electric charge. In this precise case, a double SOI is required because an electrically insulating layer must be placed between the trapping base layer and the useful layer.

According to another example, which may optionally be combined with the preceding one, the carrier substrate may comprise a layer having a particular quality, for example, a silicon layer devoid of the defects called COPs (crystal originated pits). This layer may be a CZ (Czochralski) layer of the type qualified COP-free in the literature (cf. page 27 of the work Silicon-on-Insulator Technology and Devices XI, Electrochemical Society Proceedings, Volume 2003-05), or an epitaxial semiconductor layer, which may optionally be doped.

Such a layer, in particular, allows an e-DRAM (embedded dynamic randomaccess memory) to be integrated. Embedded DRAM memories allow latency between the local memory and the system memory to be greatly decreased (by about a factor of 3) by (partially) integrating the latter directly into the chip, rather than into separate modules. To do this, the embedded DRAM memory also replaces part of the static memory (so-called SRAM). The fabrication of an embedded DRAM memory beside a logic circuit consists in burying the capacitors creating the memory effect in the substrate. The layer in which the capacitors are fabricated must be doped.

FIG. 1 is a schematic cross-sectional view of a CFET device according to one embodiment of the present disclosure.

The device comprises a carrier substrate 1. The carrier substrate may be made of bulk silicon or any other material able to serve as mechanical carrier to the device.

The carrier substrate 1 is covered with a first electrically insulating layer 2a. Advantageously, the layer 2a served as an etch-stop layer during the formation of the fin F, and hence it extends over substantially all the surface of the carrier substrate 1. However, it is not excluded for the layer 2a to have been partially or completely removed, from between two fins, the material of the layer 2a. The layer 2a may be made of silicon oxide or of another electrically insulating material, in particular, chosen for its selectivity with respect to the etch. The layer 2a may thus advantageously be a high-k dielectric.

The fin F comprises, on the first electrically insulating layer 2a, a first single-crystal semiconductor layer 2b that forms the channel of a first transistor. The height $h_{T1}$ of the channel is equal to the thickness of the layer 2b. The layer 2b is, for example, p-doped, and preferably weakly p-doped. It may be made of silicon or of another semiconductor, which may be chosen to maximize, in particular, charge-carrier mobility in the layer. Thus, the layer 2b may advantageously be made of silicon-germanium if the transistor is of p-type.

The fin comprises, on the first semiconductor layer 2b, a second electrically insulating layer 3a. The layer 3a may be made of silicon oxide or of another electrically insulating material, in particular, chosen for its low dielectric permittivity, allowing the thickness of the layer 3a to be minimized and, in exchange, the height of the channels of the two transistors to be maximized. The layer 3a may thus advantageously be a low-k dielectric, for example, carbon-doped porous $SiO_2$.

Lastly, the fin comprises, on the second electrically insulating layer 3a, a second single-crystal semiconductor layer 3b that forms the channel of a first transistor. The height $h_{T2}$ of the channel is equal to the thickness of the layer 3b. The layer 3b is, for example, n-doped, and preferably weakly n-doped. It may be made of silicon or of another semiconductor, which may be chosen to maximize, in particular, charge-carrier mobility in the layer. Thus, the layer 3b may advantageously be made of strained silicon if the transistor is of n-type.

Figure 2:
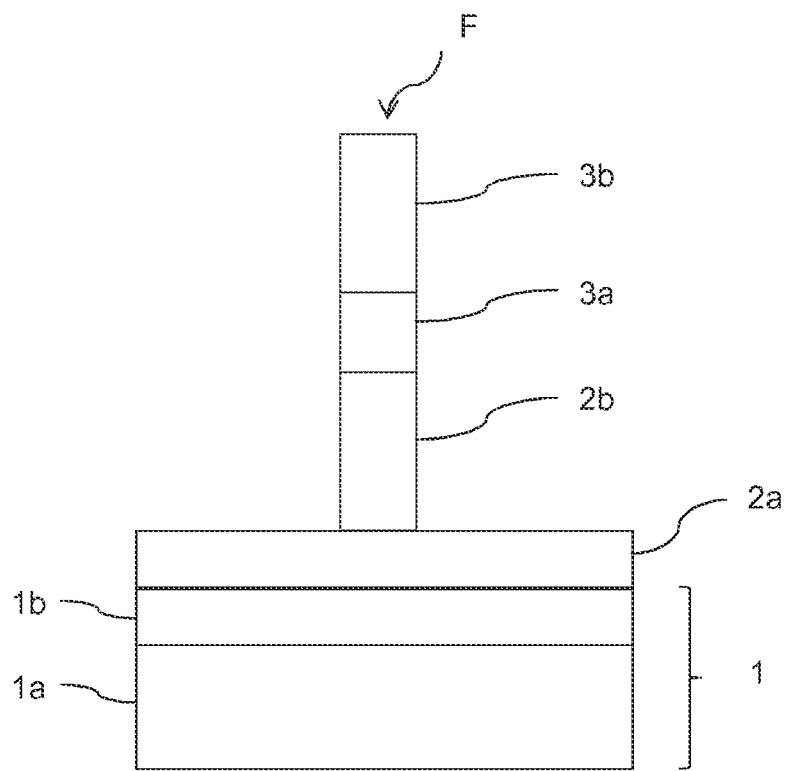
FIG. 2 is a schematic cross-sectional view of a CFET device according to another embodiment, in which the carrier substrate comprises a functional layer, FIGS. 3A to 3F schematically illustrate various fabricating steps of a double semiconductor-on-insulator substrate suitable for forming a CFET device.

FIG. 2 is a schematic cross-sectional view of a CFET device according to one embodiment of the present disclosure.

With respect to FIG. 1, the CFET device of FIG. 2 furthermore comprises a functional layer included in the carrier substrate. The carrier substrate 1 thus comprises a base substrate 1a, which is, for example, made of bulk silicon or any other material able to serve as a mechanical carrier to the device, and a functional layer 1b arranged between the base substrate 1a and the first electrically insulating layer 2a.

The functional layer 1b may be, in particular:
a polysilicon layer, performing a charge-trapping function, in particular, in radiofrequency devices;
a so-called COP-free single-crystal silicon layer, i.e., a layer devoid of or having a very low density of cavities within the crystal lattice;
an epitaxial semiconductor layer, which may optionally be doped (for example, carbon-doped Si, phosphorus-doped Si, boron-doped Si, or even SiGe).

For the sake of simplicity of the figures, a single fin F has been shown, but it goes without saying that a CFET device comprises in principle a high number of fins extending parallel to one another from the carrier substrate.

FIGS. 3A-3F schematically illustrate various steps of a process for fabricating a double SOI substrate suitable for producing the CFET devices described above.

The fabrication of such a double SOI substrate via a double layer transfer of SMARTCUT™ type must meet certain technical constraints that are specific to the production of CFET devices.

In particular, the etch of the trenches in the double SOI substrate allowing each fin to be defined must be carried out in a single step in order to guarantee the alignment of the devices and the spacing thereof. In practice, such an etch may be carried out to a depth not exceeding 90 nm, for example, over a thickness between 60 and 90 nm.

In so far as it is sought moreover to maximize the thickness of the n and p channels, in order to maximize the amount of current, the thickness of the first single-crystal semiconductor layers 2b and 3b must typically be about 25 to 40 nm, the thickness of the second electrically insulating layer 3a intermediate between the layers being between 10 and 30 nm.

The thinness of these layers therefore requires the layer-transfer process to meet particular constraints, in order to ensure a defectiveness compatible with the expected performance of the CFET device.

In particular, the thin thickness of the second electrically insulating layer 3a requires the surface of the layer to which the electrically insulating layer must be bonded (i.e., the first single-crystal semiconductor layer 2b) to have a roughness lower than 0.1 nm RMS (RMS being the acronym of root mean square) and a density of defects of 50 nm size that is as low as possible.

Moreover, the variability in the thickness of each single-crystal semiconductor layer intended to form an n or p channel must be extremely small, of about ±1.5 nm with respect to the target thickness. A variability this small cannot be obtained by means of a chemical-mechanical-polishing (CMP) process such as conventionally used to polish semiconductor surfaces, which, in particular, serve as receiver substrate in the SMARTCUT™ process.

To remedy these difficulties, it has been proposed to implement, in the first layer-transfer step, a process conventionally employed to form an FDSOI substrate (FDSOI being the acronym of fully-depleted SOI), this process comprising a high-temperature heat treatment that smoothes the surface of the transferred layer so as to achieve the required roughness. This roughness is equivalent to that obtained with chemical-mechanical polishing but allows the required variability in the thickness of the transferred layer to be achieved.

The reader may be referred to, in particular, the article by W. Schwarzenbach et al, ECS Trans. 53, p. 39 (2013) for a graph of the power spectral density (PSD) for an area of 30 μm×30 μm as a function of the spatial frequency of the defects.

However, with respect to the known process for forming a planar FDSOI substrate, it may be advantageous, in this option, to remove the step-by-step cleaning process, which is typically included in the process for fabricating an FDSOI substrate, and described in the reference W. Schwarzenbach et al, IEEE ICICDT proceeding, 2011, given that it would appear to be superfluous in so far as the thickness variability required for a CFET device is higher than the variability generally sought in a planar FDSOI substrate (which is about ±0.5 nm with respect to the target thickness). The removal of this cleaning step allows the cost of the fabrication process to be minimized while preserving the quality required for the first semiconductor layer 2b.

As regards the second layer-transfer step, it may be carried out under the same conditions as the first step, or indeed a process employed to form a PDSOI substrate may be employed (PDSOI being the acronym of partially-depleted SOI).

According to the first option, the applicant has demonstrated that, using the physical process described in the article by O. Kononchuck et al, Solid State Phenomena, vol 131-133, pp 113-118, 2008, the long-length smoothing heat treatment does not cause dissolution of the oxide of the electrically insulating layer 2a.

Figure 3A:
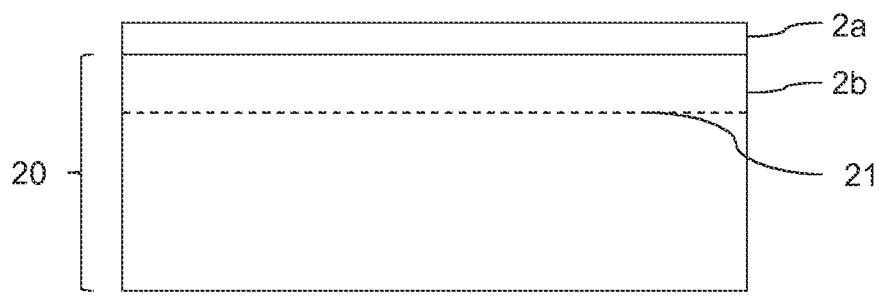
Figure 3B:
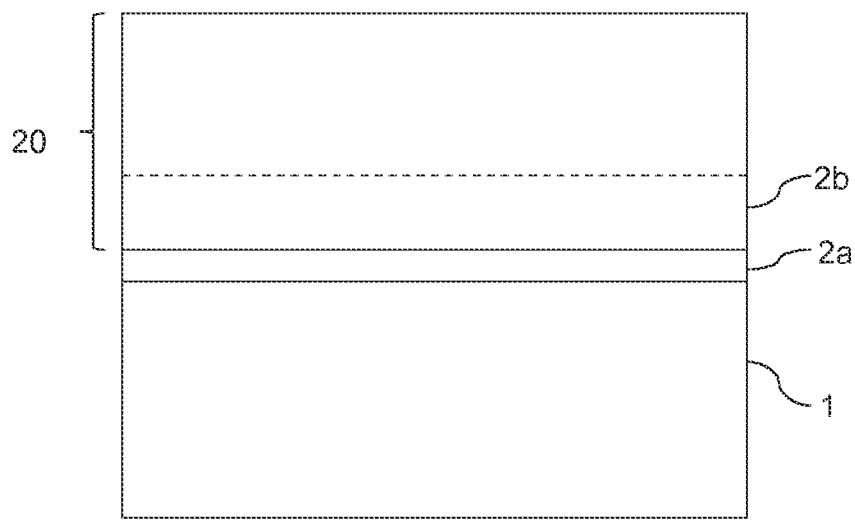
Figure 3C:
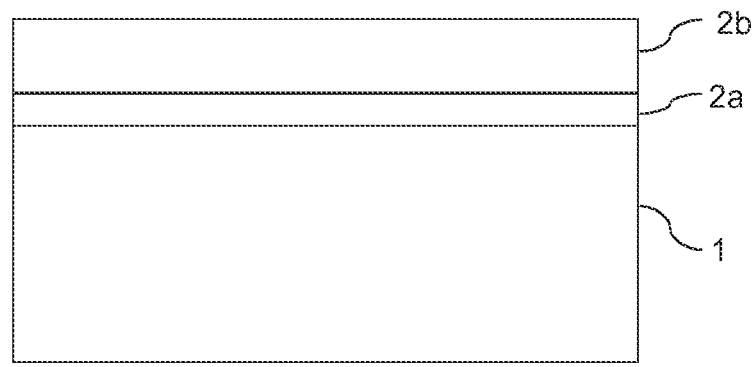

FIGS. 3A-3C schematically illustrate the first layer-transfer step.

With reference to FIG. 3A, a first single-crystal semiconductor donor substrate 20 is provided, in which a weakened zone 21 intended to define therein a first thin surface layer intended to form the layer 2b of the CFET device is formed.

As known per se, the weakened zone may be formed by implanting atomic species, such as hydrogen and/or helium, at a defined depth in the donor substrate 20.

Advantageously, the donor substrate 20 may have been covered beforehand with an electrically insulating layer, intended to form at least some of the layer 2a of the CFET device.

With reference to FIG. 3B, the first donor substrate 20 is bonded to the carrier substrate 1, the first electrically insulating layer 2a being at the bonding interface. Although not illustrated in FIG. 3B, the carrier substrate may be covered with an electrically insulating layer intended to form at least some of the layer 2a of the CFET device, in combination with the electrically insulating layer optionally present at the surface of the first donor substrate 20.

With reference to FIG. 3C, the first donor substrate 20 is detached along the weakened zone 21, so as to transfer the layer 2b to the carrier substrate.

As indicated above, a process for finishing the transferred layer 2b is carried out on the first SOI substrate thus formed, in order to repair or remove defects related to the detaching step and to give the layer the final roughness and thickness characteristics desired. Such processing, in particular, comprises a heat treatment at a high temperature, typically comprised between 1000 and 1200° C., and of a relatively long length, typically comprised between 10 and 120 minutes. This heat treatment has the effect of smoothing the surface, until a roughness lower than 0.1 nm RMS is achieved.

Figure 3D:
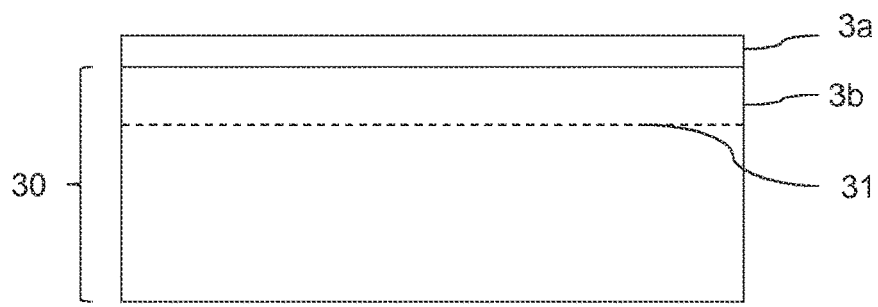
Figure 3E:
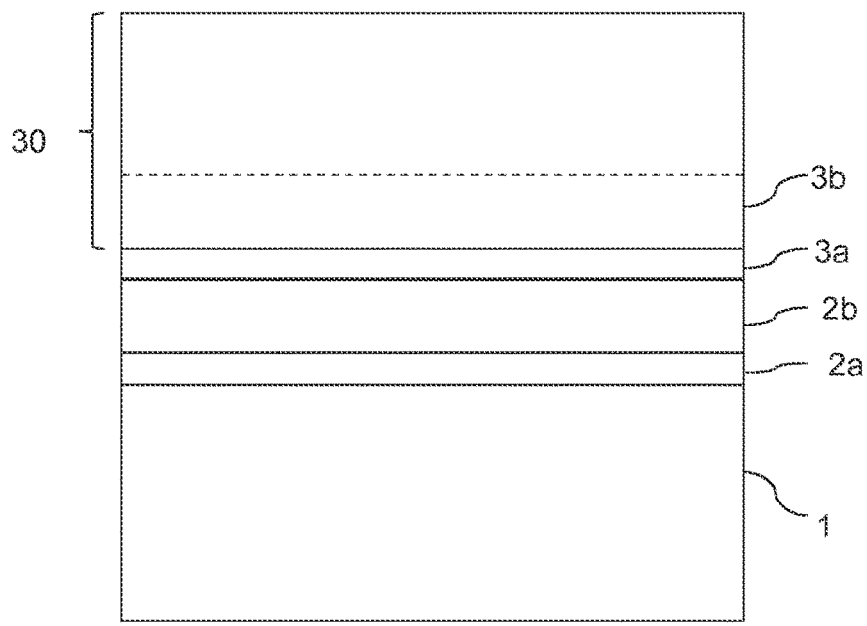
Figure 3F:
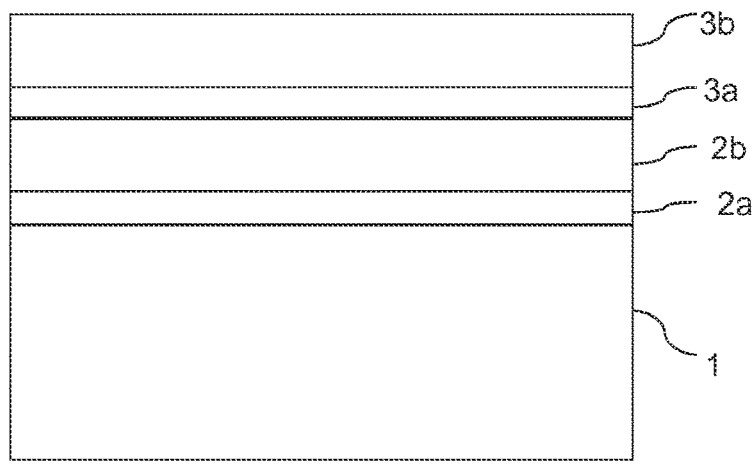

FIGS. 3D-3F schematically illustrate the second layer-transfer step.

With reference to FIG. 3D, a second single-crystal semiconductor donor substrate 30 is provided, in which a weakened zone 31 intended to define therein a first thin surface layer intended to form the layer 3b of the CFET device is formed. Although the second donor substrate has been referenced with a reference sign different from that of the first donor substrate 20, it may be a question of the same substrate, the first donor substrate having been processed after the detachment in order to remove implantation-related defects. However, advantageously, the materials of the first and second donor substrates are different (for example, in terms of composition, crystal orientation, doping and/or strain) and chosen depending on the nature of the channel that they are intended to form.

As known per se, the weakened zone may be formed by implanting atomic species, such as hydrogen and/or helium, at a defined depth in the second donor substrate 30.

Advantageously, the donor substrate 30 may have been covered beforehand with an electrically insulating layer intended to form at least some of the layer 3a of the CFET device.

With reference to FIG. 3E, the second donor substrate 30 is bonded to the SOI substrate obtained at the end of the first layer-transfer step, the first electrically insulating layer 2a being at the bonding interface.

With reference to FIG. 3F, the second donor substrate 30 is detached along the weakened zone 31, so as to transfer the layer 2b to the SOI substrate.

As indicated above, according to one embodiment (of the type of a process for fabricating an FDSOI substrate), a process for finishing the transferred layer 3b is carried out on the double SOI substrate thus formed, in order to repair or remove defects related to the detaching step and to give the layer the final roughness and thickness characteristics desired. Such processing, in particular, comprises a heat treatment at a high temperature, typically comprised between 1000 and 1200° C., and of a relatively long length, typically comprised between 10 and 120 minutes. This heat treatment has the effect of smoothing the surface, until a roughness lower than 0.1 nm RMS is achieved.

According to another embodiment (of the type of a process for fabricating a PDSOI substrate), a process for finishing the transferred layer 3b is carried out on the double SOI substrate thus formed, in order to repair or remove defects related to the detaching step and to give the layer the final roughness and thickness characteristics desired. Such processing, in particular, comprises heat treatments at a high temperature, typically comprised between 1100 and 1250° C., and of a relatively short length, typically shorter than one minute. These heat treatments have the effect of smoothing the surface, until a roughness lower than 0.5 nm RMS is achieved.

Next, trenches are formed in the double SOI substrate by etching as far as to the first electrically insulating layer 2a, so as to define one or more fins such as illustrated in FIG. 1. During this etch, the layer 2a advantageously plays the role of etch-stop layer.

In certain forms of execution, it may be advantageous to include a functional layer 1b in the carrier substrate 1, as illustrated in FIG. 2.

In this case, the thermal budget implemented in the fabrication of the double SOI substrate may be critical. Specifically, if the functional layer 1b comprises polysilicon, the application of a high-temperature heat treatment to smooth the first semiconductor layer 2b may cause the recrystallization of the polysilicon of the functional layer 1b, thus making it lose all or some of its charge-trapping properties. In another example, if the functional layer 1b is doped, the application of a high-temperature heat treatment to smooth the first semiconductor layer 2b may cause the diffusion of the dopant within the SOI substrate, preventing the integration of an e-DRAM memory.

In this case, it is advantageous to use, to form the layer 2b, a layer-transfer process that allows a very low roughness and a very low defectiveness to be obtained with a limited thermal budget. Such a process may be implemented under the following conditions: the first donor substrate 20 will preferably bear two layers of material, one serving as carrier for a selective etch process, the second forming the layer 2b. These two layers may advantageously be created by epitaxy. A weakened zone may be formed by implanting atomic species, such as hydrogen and/or helium, at a defined depth strictly larger than the thickness of the two aforementioned layers. Advantageously, the first donor substrate 20 may have been covered beforehand with an electrically insulating layer intended to form at least some of the layer 2a of the CFET device.

With reference to FIG. 3B, the first donor substrate 20 is bonded to the carrier substrate 1, the first electrically insulating layer 2a being at the bonding interface. Although not illustrated in FIG. 3B, the carrier substrate may be covered with an electrically insulating layer intended to form at least some of the layer 2a of the CFET device, in combination with the electrically insulating layer optionally present at the surface of the first donor substrate 20.

With reference to FIG. 3C, the first donor substrate 20 is detached along the weakened zone 21, so as to transfer the layer 2b to the carrier substrate.

Finishing processing consisting of a selective etch that stops on each of the two layers created beforehand is then carried out on the first SOI substrate thus formed. Such finishing processing does not comprise any processing at a temperature above 500° C. It allows, at the end thereof, a surface the roughness of which is lower than 0.1 nm RMS to be achieved.

As regards the layer 3b transferred in the second layer-transfer step, the same constraints related to thermal budget apply but, as indicated above, a PDSOI process is sufficient to obtain the quality required for the layer 3b with a heat treatment that does not deteriorate the properties of the functional layer 1b.

In the case where the layer 2b is a silicon-germanium layer (in particular, in the case where this layer is intended to form the channel of a p-type transistor), it may be advantageous to form the SiGe layer by epitaxy on an SOI substrate. Specifically, an epitaxial SiGe layer of 30 nm, the variability in the thickness of which is about 3%, allows the variability criterion of the CFET device to be met. Such a silicon-germanium-on-insulator (SiGeOI) substrate created by epitaxy on an SOI substrate may serve as receiver substrate in the second layer-transfer step. This second layer-transfer step may advantageously be designed to transfer a layer 3b of strained silicon (intended to form the channel of an n-type transistor) to the SiGeOI substrate.

According to one embodiment, the second donor substrate may comprise an SiGe seed layer and an epitaxial Si layer formed on the seed layer, the SiGe imposing its lattice parameter during the growth of the silicon, thus creating a strain in the silicon. Next, in a way known per se, a weakened zone intended to define the layer 3b to be transferred is formed in the silicon-germanium layer, then the second donor substrate is bonded to the SiGeOI substrate by way of a second electrically insulating layer 3a. The electrically insulating layer may have been formed, in particular, on the strained silicon before the implantation intended to form the weakened zone.

According to one embodiment, the second donor substrate may be made of unstrained silicon. In a way known per se, a weakened zone intended to define the layer 3b to be transferred is formed in the silicon, then the second donor substrate is bonded to the SiGeOI substrate by way of a second electrically insulating layer 3a. The electrically insulating layer may have been formed, in particular, on the second donor substrate before the implantation intended to form the weakened zone. The formation of the trenches intended to separate the fins also has the effect of transferring at least some of the strain of the SiGe layer 2b (which generally has a gradual strain due to its formation by epitaxy on an SOI substrate) to the silicon layer 3b. In the CFET device thus obtained, the SiGe layer 2b is then relaxed whereas the silicon layer 3b is strained.

REFERENCES

W. Schwarzenbach et al, Atomic Scale Thickness Control of SOI Wafers for Fully Depleted Applications, ECS Trans. 53, p. 39 (2013)

W. Schwarzenbach et al, Excellent Silicon Thickness Uniformity Ultra-Thin SOI for controlling Vt variation of FDSOI, IEEE ICICDT proceeding, 2011

O. Kononchuck et al, Internal Dissolution of Buried Oxide in SOI Wafers, Solid State Phenomena, vol 131-133, pp 113-118, 2008

The invention claimed is:

1. A method of fabricating a CFET device, comprising:
forming a double semiconductor-on-insulator substrate comprising, in succession, from its base to its surface: a carrier substrate, a first electrically insulating layer, a first single-crystal semiconductor layer, a second electrically insulating layer and a second single-crystal semiconductor layer;
forming trenches from the surface of the substrate, to the first electrically insulating layer, so as to form at least one fin (F), and
in each fin (F), forming a channel of a first transistor in the first semiconductor layer and a channel of a second transistor of opposite type to the first transistor in the second semiconductor layer,
the formation of the double semiconductor-on-insulator substrate comprising:
a first layer-transfer step to transfer the first electrically insulating layer and the first single-crystal semiconductor layer to the carrier substrate, so as to form a first semiconductor-on-insulator substrate, the first layer-transfer step comprising a heat treatment at a sufficiently high temperature to smooth the first single-crystal semiconductor layer to a roughness lower than 0.1 nm RMS, and
after the heat treatment, a second layer-transfer to transfer the second electrically insulating layer and the second single-crystal semiconductor layer to the first single-crystal semiconductor layer of the first semiconductor-on-insulator substrate.

2. The method of claim 1, wherein the trenches are formed by etching, the first electrically insulating layer forming a stop layer for the etching.

3. The method of claim 2, wherein the thickness of the first and second single-crystal semiconductor layers is between 25 and 40 nm.

4. The method of claim 3, wherein the thickness of the second electrically insulating layer is between 10 and 30 nm.

5. The method of claim 4, wherein the first and second semiconductor layers comprise silicon doped with opposite polarities.

6. The method of claim 1, wherein the first and second semiconductor layers comprise silicon having different crystal orientations.

7. The method of claim 1, wherein the first and second semiconductor layers comprise different materials.

8. The method of claim 1, wherein the semiconductor layer in which a channel of an n-type transistor is disposed comprises strained silicon.

9. The method of claim 1, wherein the semiconductor layer in which a channel of a p-type transistor is disposed comprises silicon-germanium.

10. The method of claim 1, wherein the first and/or second electrically insulating layers comprise silicon oxide ($SiO_2$).

11. The method of claim 1, wherein the first and second electrically insulating layers comprise different materials.

12. The method of claim 1, wherein the first electrically insulating layer comprises a high-k material.

13. The method of claim 1, wherein the second electrically insulating layer comprises a low-k material.

14. The method of claim 1, further comprising epitaxially growing a semiconductor layer on the carrier substrate.

15. The method of claim 1, wherein the carrier substrate comprises at least one COP-free CZ silicon layer.

16. The method of claim 1, wherein the smoothing heat treatment of the first single-crystal semiconductor layer is carried out at a temperature between 1000 and 1200° C., for a time between 10 and 120 minutes.

17. The method of claim 1, further comprising a heat treatment for finishing the second single-crystal semiconductor layer at a temperature between 1100 and 1250° C., carried out for less than one minute.

18. The method of claim 1, wherein the thickness of the first and second single-crystal semiconductor layers is between 25 and 40 nm.

19. The method of claim 1, wherein the thickness of the second electrically insulating layer is between 10 and 30 nm.

20. The method of claim 1, wherein the first and second semiconductor layers comprise silicon doped with opposite polarities.

* * * * *